(12) United States Patent
Kuroda et al.

(10) Patent No.: US 12,435,248 B2
(45) Date of Patent: Oct. 7, 2025

(54) TEMPORARY PROTECTIVE FILM FOR SEMICONDUCTOR ENCAPSULATION MOLDING, LEAD FRAME PROVIDED WITH TEMPORARY PROTECTIVE FILM, ENCAPSULATION MOLDED BODY, AND METHOD FOR MANUFACTURING SEMICONDUCTOR PACKAGE

(71) Applicant: Resonac Corporation, Tokyo (JP)

(72) Inventors: Takahiro Kuroda, Tokyo (JP); Naoki Tomori, Tokyo (JP); Tomohiro Nagoya, Tokyo (JP)

( * ) Notice: Subject to any disclaimer, the term of this patent is extended or adjusted under 35 U.S.C. 154(b) by 488 days.

(21) Appl. No.: 17/995,407

(22) PCT Filed: Apr. 5, 2021

(86) PCT No.: PCT/JP2021/014507
§ 371 (c)(1),
(2) Date: Oct. 4, 2022

(87) PCT Pub. No.: WO2021/206058
PCT Pub. Date: Oct. 14, 2021

(65) Prior Publication Data
US 2023/0174828 A1 Jun. 8, 2023

(30) Foreign Application Priority Data

Apr. 6, 2020 (JP) .................................. 2020-068391

(51) Int. Cl.
*C08K 5/06* (2006.01)
*C09J 7/38* (2018.01)
(Continued)

(52) U.S. Cl.
CPC .............. *C09J 7/38* (2018.01); *H01L 21/568* (2013.01); *H01L 23/293* (2013.01);
(Continued)

(58) Field of Classification Search
CPC .. C09J 7/38; C09J 2203/326; C09J 2301/502; H01L 21/568; H01L 23/293;
(Continued)

(56) References Cited

U.S. PATENT DOCUMENTS

2009/0053498 A1* 2/2009 Matsuura .............. H01L 21/568
428/220
2020/0048501 A1* 2/2020 Igarashi ................. C09J 201/00

FOREIGN PATENT DOCUMENTS

CN    1591807    3/2005
CN    1698200   11/2005
(Continued)

OTHER PUBLICATIONS

International Search Report dated Jul. 6, 2021 for PCT/JP2021/014507.
(Continued)

*Primary Examiner* — Dale E Page
*Assistant Examiner* — Cristian A Tivarus
(74) *Attorney, Agent, or Firm* — SOEI PATENT & LAW FIRM

(57) ABSTRACT

A temporary protective film for semiconductor encapsulation molding includes a support film and an adhesive layer. The adhesive layer contains a thermoplastic resin and at least one compound selected from the group consisting of sorbitol polyglycidyl ether, polyethylene glycol diglycidyl ether, a glycidyl ether of an aliphatic alcohol having 10 to 20 carbon atoms, glycerol polyglycidyl ether, a polyalkylene glycol ester of a fatty acid having 2 to 30 carbon atoms, a dipentaerythritol ester of a fatty acid having 2 to 20 carbon atoms, polyethylene glycol monoalkyl ether, and polyethylene glycol dialkyl ether.

8 Claims, 8 Drawing Sheets

(51) Int. Cl.
    *C09J 11/06*     (2006.01)
    *C09J 11/08*     (2006.01)
    *H01L 21/56*     (2006.01)
    *H01L 23/29*     (2006.01)
    *H01L 23/31*     (2006.01)
    *H01L 23/495*     (2006.01)
    *H01L 23/00*     (2006.01)

(52) U.S. Cl.
CPC .... *H01L 23/3107* (2013.01); *H01L 23/49506* (2013.01); *C09J 2203/326* (2013.01); *C09J 2301/502* (2020.08); *H01L 24/46* (2013.01); *H01L 2924/0665* (2013.01); *H01L 2924/1811* (2013.01); *H01L 2924/186* (2013.01)

(58) Field of Classification Search
CPC ........... H01L 23/3107; H01L 23/49506; H01L 24/46; H01L 2924/0665; H01L 2924/1811; H01L 2924/186
See application file for complete search history.

(56) References Cited

FOREIGN PATENT DOCUMENTS

| | | |
|---|---|---|
| CN | 108603028 | 9/2018 |
| CN | 110191933 | 8/2019 |
| CN | 110603624 | 12/2019 |
| JP | H5-129473 | 5/1993 |
| JP | H10-012773 | 1/1998 |
| JP | 2003-086614 | 3/2003 |
| JP | 2008-103700 | 5/2008 |
| JP | 2008-258492 | 10/2008 |
| JP | 2008-277802 | 11/2008 |
| JP | 2015-138940 | 7/2015 |
| JP | 2016-192503 | 11/2016 |
| KR | 10-2018-0100647 | 9/2018 |
| TW | 201900801 | 1/2019 |
| WO | 2018/207408 | 11/2018 |
| WO | 2019/176596 | 9/2019 |
| WO | 2019/176597 | 9/2019 |

OTHER PUBLICATIONS

International Search Report dated Jun. 29, 2021 for PCT/JP2021/014555.
International Preliminary Report on Patentability with Written Opinion dated Oct. 20, 2022 for PCT/JP2021/014507.
International Preliminary Report on Patentability with Written Opinion dated Oct. 20, 2022 for PCT/JP2021/014555.
Soei Patent and Law Firm, Statement of Related Matters, dated Nov. 15, 2022.

* cited by examiner

TEMPORARY PROTECTIVE FILM FOR SEMICONDUCTOR ENCAPSULATION MOLDING, LEAD FRAME PROVIDED WITH TEMPORARY PROTECTIVE FILM, ENCAPSULATION MOLDED BODY, AND METHOD FOR MANUFACTURING SEMICONDUCTOR PACKAGE

CROSS-REFERENCE TO RELATED APPLICATIONS

This application is a 35 U.S.C. § 371 national phase application of PCT/JP2021/014507, filed on Apr. 5, 2021, which claims priority to Japanese Patent Application No. 2020-068391, filed on Apr. 6, 2020.

TECHNICAL FIELD

The present disclosure relates to a temporary protective film for semiconductor encapsulation molding, a lead frame provided with a temporary protective film, an encapsulation molded body, and a method for manufacturing a semiconductor package.

BACKGROUND ART

In a semiconductor package, a structure in which a sealing layer is formed only on a semiconductor element side of a lead frame and the rear surface of the lead frame is exposed may be employed (Patent Literatures 1 and 2). In the manufacturing of the semiconductor package having this structure, in order to prevent a sealing resin from flowing to the rear surface of the lead frame at the time of encapsulation molding, the rear surface of the lead frame may be temporarily protected by bonding a temporary protective film to the rear surface of the lead frame. The temporary protective film is peeled off from the lead frame after the sealing layer is formed.

CITATION LIST

Patent Literature

Patent Literature 1: Japanese Unexamined Patent Publication No. H5-129473
Patent Literature 2: Japanese Unexamined Patent Publication No. H10-12773

SUMMARY OF INVENTION

Technical Problem

The assembly processing for manufacturing a semiconductor package may require heating at a high temperature reaching about 400° C. for reflow connection and the like. However, when the temporary protective film bonded to the lead frame receives a thermal history at such a high temperature, the temporary protective film, the lead frame, and the sealing layer are firmly attached to one another, and thus there is a case where the temporary protective film cannot be peeled off from the lead frame or a case where the temporary protective film is difficult to be clearly peeled off from the lead frame without residues remaining.

The present disclosure relates to a temporary protective film for semiconductor encapsulation molding, the temporary protective film capable of being bonded to a lead frame with an appropriate adhesive force and capable of being easily peeled off after receiving a thermal history at a high temperature of about 400° C.

Solution to Problem

An aspect of the present disclosure provides a temporary protective film comprising a support film and an adhesive layer provided on one surface or both surfaces of the support film. This temporary protective film is a temporary protective film for semiconductor encapsulation molding that is used for temporarily protecting a surface of a lead frame on a side opposite to a semiconductor element during encapsulation molding of forming a sealing layer that seals the semiconductor element mounted on a die pad of the lead frame. In other words, an aspect of the present disclosure provides an application of a temporary protective film for temporarily protecting a surface of a lead frame on a side opposite to a semiconductor element during encapsulation molding of forming a sealing layer that seals the semiconductor element mounted on a die pad of the lead frame. The adhesive layer contains a thermoplastic resin and at least one specific compound selected from the group consisting of sorbitol polyglycidyl ether, polyethylene glycol diglycidyl ether, a glycidyl ether of an alkyl alcohol having 10 to 20 carbon atoms, glycerol polyglycidyl ether, a polyalkylene glycol ester of a fatty acid having 6 to 24 carbon atoms, a dipentaerythritol ester of a fatty acid having 4 to 12 carbon atoms, polyalkylene glycol monoalkyl ether, and polyalkylene glycol dialkyl ether.

Another aspect of the present disclosure provides a lead frame provided with a temporary protective film, comprising: a lead frame having a die pad; and the above-described temporary protective film for semiconductor encapsulation molding. The temporary protective film is bonded to one surface of the lead frame in a direction in which the adhesive layer of the temporary protective film comes into contact with the lead frame.

Still another aspect of the present disclosure provides a temporarily protected encapsulation molded body, comprising: a lead frame having a die pad; a semiconductor element mounted on the die pad on one surface side of the lead frame; a sealing layer sealing the semiconductor element; and the above-described temporary protective film for semiconductor encapsulation molding. The temporary protective film is bonded to a surface of the lead frame on a side opposite to the semiconductor element in a direction in which the adhesive layer of the temporary protective film comes into contact with the lead frame.

Still another aspect of the present disclosure provides a method for manufacturing a semiconductor package, the method comprising, in the stated order: a step of bonding the temporary protective film for semiconductor encapsulation molding according to claim 1 or 2 to one surface of a lead frame having a die pad in a direction in which the adhesive layer of the temporary protective film comes into contact with the lead frame; a step of mounting a semiconductor element on a surface of the die pad on a side opposite to the temporary protective film; a step of forming a sealing layer sealing the semiconductor element to obtain a temporarily protected encapsulation molded body having the lead frame, the semiconductor element, and the sealing layer; and a step of peeling off the temporary protective film from the encapsulation molded body.

Advantageous Effects of Invention

According to an aspect of the present disclosure, there is provided a temporary protective film for semiconductor encapsulation molding, the temporary protective film capable of being bonded to a lead frame with an appropriate adhesive force and capable of being easily peeled off after receiving a thermal history at a high temperature of about 400° C.

DESCRIPTION OF EMBODIMENTS

The present invention is not limited to some embodiments illustrated below. Upper limit values and lower limit values in the numerical range described in the present specification can be arbitrarily combined. Values described in Examples can also be used as upper limit values or lower limit values in the numerical range.

Temporary Protective Film

Figure 1:
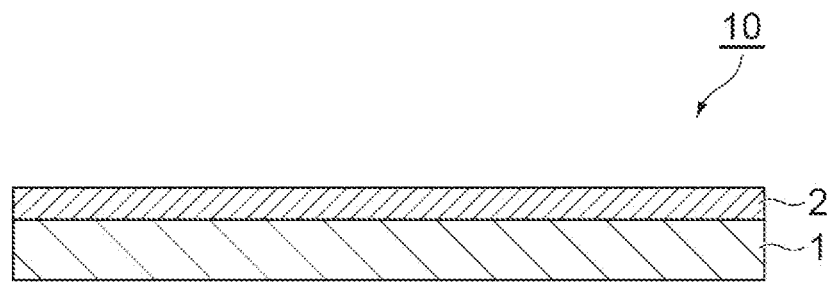
FIG. 1 is a cross-sectional view illustrating an embodiment of a temporary protective film.
Figure 2:
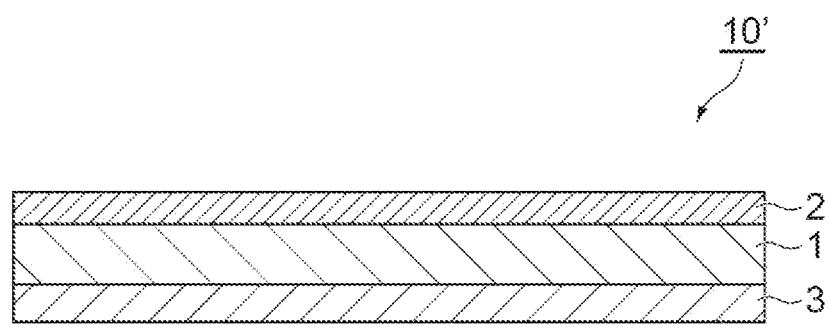
FIG. 2 is a cross-sectional view illustrating an embodiment of a temporary protective film.

FIG. 1 is a cross-sectional view illustrating a temporary protective film according to an embodiment. A temporary protective film 10 illustrated in FIG. 1 has a support film 1 and an adhesive layer 2 provided on one surface of the support film 1. An adhesive layer may be formed on both surfaces of the support film 1. FIG. 2 is also a cross-sectional view illustrating a temporary protective film according to an embodiment. A temporary protective film 10' illustrated in FIG. 2 has the support film 1, the adhesive layer 2 provided on one main surface of the support film 1, and a non-adhesive layer 3 provided on the other main surface of the support film 1. These temporary protective films can be used as a temporary protective film for semiconductor encapsulation molding for temporarily protecting a lead frame during encapsulation molding by bonding the temporary protective film to a rear surface of the lead frame (a surface on a side opposite to a surface on which a semiconductor element is mounted) in an encapsulation molding step of forming a sealing layer that seals the semiconductor element mounted on a die pad of the lead frame.

The adhesive layer 2 contains a thermoplastic resin and a specific compound selected from an epoxy compound and the like.

The thermoplastic resin may contain at least one selected from the group consisting of an aromatic polyether amideimide, an aromatic polyether imide, an aromatic polyether amide, an aromatic polyamide, an aromatic polyester, an aromatic polyimide, an aromatic polyamideimide, and an aromatic polyether, and an aromatic polyester imide. From the viewpoint of heat resistance and adhesiveness, the thermoplastic resin may be at least one selected from the group consisting of an aromatic polyether amideimide, an aromatic polyether imide, and an aromatic polyether amide, and may be an aromatic polyether amideimide.

The aromatic polyether amideimide is a polycondensate formed from an acid component containing an aromatic tricarboxylic acid or a reactive derivative thereof and an amine component containing an aromatic diamine, and can be a polycondensate in which at least one of an aromatic tricarboxylic acid and an aromatic diamine contains a compound having a plurality of aromatic groups and an oxy group that binds aromatic groups to each other. The aromatic polyether imide is a polycondensate formed from an acid component containing an aromatic tetracarboxylic acid or a reactive derivative thereof and an amine component containing an aromatic diamine, and can be a polycondensate in which at least one of an aromatic tetracarboxylic acid and an aromatic diamine contains a compound having a plurality of aromatic groups and an oxy that binds aromatic groups to each other. The aromatic polyether amide is a polycondensate formed from an acid component containing an aromatic dicarboxylic acid or a reactive derivative thereof and an amine component containing an aromatic diamine, and can be a polycondensate in which at least one of an aromatic dicarboxylic acid and an aromatic diamine contains a compound having a plurality of aromatic groups and an oxy that binds aromatic groups to each other. The reactive derivative of carboxylic acid may be, for example, an acid anhydride or an acid chloride.

The aromatic polyether amideimide and the aromatic polyamideimide may contain a constitutional unit derived from trimellitic acid or a reactive derivative thereof. The aromatic polyimide and the aromatic polyether imide may contain a constitutional unit derived from pyromellitic acid, polynuclear aromatic tetracarboxylic acid, or reactive derivatives thereof. Examples of the polynuclear aromatic tetracarboxylic acid include bisphenol A bistrimellitate and oxydiphthalic acid. The aromatic polyamide may contain a constitutional unit derived from terephthalic acid, isophthalic acid, or reactive derivatives thereof.

The aromatic polyether amideimide, the aromatic polyether imide, and the aromatic polyether amide may contain, for example, a constitutional unit derived from an aromatic diamine having an oxy group, selected from 2,2-bis[4-(4-aminophenoxy)phenyl]propane, bis[4-(4-aminophenoxy)phenyl]sulfone, 4,4'-diaminodiphenyl ether, bis[4-(4-aminophenoxy)phenyl]ether, and 2,2-bis[4-(4-aminophenoxy)]hexafluoropropane. The aromatic polyether amideimide, the aromatic polyether imide, and the aromatic polyether amide may further contain a constitutional unit derived from other diamine selected from an aromatic diamine not having an oxy group (for example, 4,4'-methylenebis(2-isopropylaniline)), siloxane diamine (for example, 1,3-bis(3-aminopropyl)tetramethyldisiloxane), and α,ω-diaminoalkane (for example, 1,12-diaminododecane or 1,6-diaminohexane).

In the aromatic polyether imide, the aromatic polyether amideimide, and the aromatic polyether amide, the ratio of the constitutional unit derived from an aromatic diamine having an oxy group may be 40 to 100 mol % or 50 to 97 mol % on the basis of the total amount of the constitutional unit derived from the diamine component. In the aromatic polyether imide, the aromatic polyether amideimide, and the aromatic polyether amide, the ratio of the constitutional unit derived from an aromatic diamine having an oxy group may be 60 to 89 mol % or 68 to 82 mol %, the ratio of the constitutional unit derived from siloxane diamine may be 1 to 10 mol % or 3 to 7 mol %, and the ratio of the constitutional unit derived from α,ω-diaminoalkane may be 10 to 30 mol % or 15 to 25 mol %, on the basis of the total amount of the constitutional unit derived from the diamine component. In the aromatic polyether imide, the aromatic polyether amideimide, and the aromatic polyether amide, the ratio of the constitutional unit derived from an aromatic diamine having an oxy group may be 90 to 99 mol % or 93 to 97 mol % and the ratio of the constitutional unit derived from siloxane diamine may be 1 to 10 mol % or 3 to 7 mol %, on the basis of the total amount of the constitutional unit derived from the diamine component. In the aromatic polyether imide, the aromatic polyether amideimide, and the aromatic polyether amide, the ratio of the constitutional unit derived from an aromatic diamine having an oxy group may be 40 to 70 mol % or 45 to 60 mol % and the ratio of the constitutional unit derived from an aromatic diamine not having an oxy group may be 30 to 60 mol % or 40 to 55 mol %, on the basis of the total amount of the constitutional unit derived from the diamine component.

The specific compound may be an epoxy compound (epoxy resin) having one or more epoxy groups (or glycidyl ether groups). The number of epoxy groups which the epoxy compound has may be 5 or less. The adhesive layer 2 may contain at least one epoxy compound selected from the group consisting of sorbitol polyglycidyl ether, polyethylene glycol diglycidyl ether, a glycidyl ether of an aliphatic alcohol having 10 to 20 carbon atoms, and glycerol polyglycidyl ether. From the viewpoint of peelability from the lead frame after receiving a thermal history at 400° C., the epoxy compound may be sorbitol polyglycidyl ether, polyethylene glycol diglycidyl ether, or a combination thereof. The adhesive layer 2 may further contain an epoxy compound other than these compounds.

The sorbitol polyglycidyl ether is a compound having a sorbitol residue and two or more glycidyl ether groups bonded thereto, and may be a mixture of two or more kinds of components each having a different number of glycidyl ether groups. The epoxy equivalent of the sorbitol polyglycidyl ether may be, for example, 150 to 200 g/eq.

The epoxy equivalent of the polyethylene glycol diglycidyl ether may be, for example, 200 to 400 g/eq. or 250 to 350 g/eq.

The glycidyl ether of an aliphatic alcohol having 10 to 20 carbon atoms is a compound having an aliphatic group (for example, a straight-chain alkyl group) having 10 to 20 carbon atoms and a glycidyl ether group bonded thereto. The glycidyl ether of an aliphatic alcohol may be a mixture of two or more kinds of components each having a different number of carbon atoms of the aliphatic group. The epoxy equivalent of the glycidyl ether of an aliphatic alcohol may be, for example, 200 to 400 g/eq.

The glycerol polyglycidyl ether is a compound having a glycerol residue and two or more glycidyl ether groups bonded thereto, and may be a mixture of two or more kinds of components each having a different number of glycidyl ether groups. The epoxy equivalent of the glycerol polyglycidyl ether may be, for example, 120 to 160 g/eq.

The specific compound may be a polyalkylene glycol ester of a fatty acid having 2 to 30 carbon atoms, a dipentaerythritol ester of a fatty acid having 2 to 20 carbon atoms, polyethylene glycol monoalkyl ether, polyethylene glycol dialkyl ether, or a combination thereof.

The polyalkylene glycol ester of a fatty acid having 2 to 30 carbon atoms is an ester compound formed from one or two molecules of fatty acid (for example, aliphatic saturated monobasic acid) having 2 to 30 carbon atoms and one molecule of polyalkylene glycol. The number of carbon atoms of the fatty acid may be 4 to 24 or 6 to 20.

The dipentaerythritol ester of a fatty acid having 2 to 20 carbon atoms is an ester compound formed from one or six molecules of a fatty acid (for example, aliphatic saturated monobasic acid) having 2 to 20 carbon atoms and one molecule of dipentaerythritol. The number of carbon atoms of the fatty acid may be 4 to 16 or 6 to 12. Examples of the dipentaerythritol ester of a fatty acid having 2 to 20 carbon atoms include dipentaerythritol aliphatic saturated monobasic acid (the number of carbon atoms: 4 to 12) hexaester.

The polyethylene glycol monoalkyl ether and the polyethylene glycol dialkyl ether are ether compounds formed from one molecule of polyethylene glycol and one or two molecules of alkyl alcohol. The number of carbon atoms of the alkyl alcohol may be 2 to 30, 4 to 24, 6 to 20, or 8 to 16. The alkyl alcohol may be a secondary alcohol. Examples of the polyethylene glycol monoalkyl ether and the polyethylene glycol dialkyl ether include polyoxyethylene (9) secondary alkyl (the number of carbon atoms: 11 to 15) ether.

The content of the specific compound may be 5 to 30 parts by mass, 5 to 25 parts by mass, 5 to 20 parts by mass, 5 to 15 parts by mass, or 7 to 15 parts by mass, with respect to 100 parts by mass of the content of the thermoplastic resin, from the viewpoint of peelability from the lead frame after receiving a thermal history at 400° C. From the same viewpoint, the content of sorbitol polyglycidyl ether may be 5 to 20 parts by mass or 5 to 12 parts by mass with respect to 100 parts by mass of the content of the thermoplastic resin, and the content of polyethylene glycol diglycidyl ether may be 5 to 20 parts by mass or 7 to 15 parts by mass with respect to 100 parts by mass of the content of the thermoplastic resin.

The adhesive layer may further contain one or more kinds of coupling agents. The coupling agent may be a silane coupling agent. The silane coupling agent may be a compound represented by Formula (I) below:

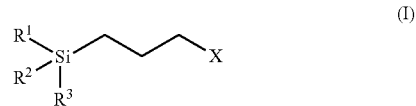

(I)

In Formula (I), $R^1$, $R^2$, and $R^3$ each independently represent an alkoxy group having 1 to 3 carbon atoms, an alkyl group having 1 to 6 carbon atoms, or an aryl group having 6 to 12 carbon atoms, and X represents a group containing a reactive functional group.

Examples of the alkoxy group having 1 to 3 carbon atoms for $R^1$, $R^2$, or $R^3$ include a methoxy group, an ethoxy group, and a propoxy group. Examples of the alkyl group having 1 to 6 carbon atoms for $R^1$, $R^2$, or $R^3$ include a methyl group, an ethyl group, a propyl group, an isopropyl group, a butyl group, an isobutyl group, a tert-butyl group, a pentyl group, and a hexyl group. Examples of the aryl group having 6 to 12 carbon atoms for $R^1$, $R^2$, or $R^3$ include a phenyl group, a tolyl group, a xylyl group, and a naphthyl group.

The reactive functional group which X has may be, for example, an amino group, an isocyanate group, an amide group, or an epoxy group. X may be a group represented by Formula (IIa), (IIb), (IIc), (IId), or (IIe) below:

(IIa)

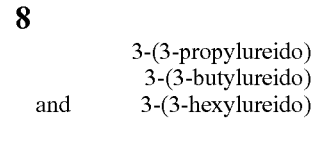
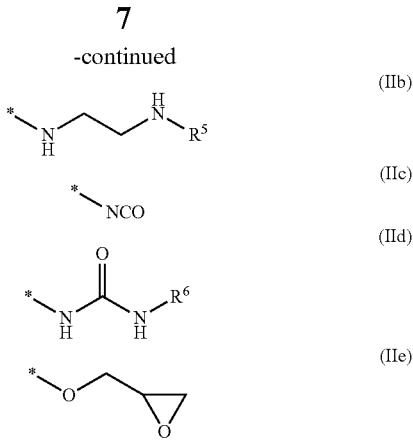

In these formulae, $R^4$, $R^5$, and $R^6$ represent an alkyl group having 1 to 6 carbon atoms, an aryl group having 6 to 12 carbon atoms, or a hydrogen atom. "*" represents a binding site with a carbon atom. $R^4$, $R^5$, and $R^6$ may be an alkyl group having 1 to 6 carbon atoms selected from a methyl group, an ethyl group, a propyl group, an isopropyl group, a butyl group, an isobutyl group, a tert-butyl group, a pentyl group, and a hexyl group, or an aryl group having 6 to 12 carbon atoms selected from a phenyl group, a tolyl group, a xylyl group, and a naphthyl group.

Examples of the silane coupling agent in which X is the group represented by Formula (IIa) include 3-aminopropyltrimethoxysilane, 3-aminopropylmethyldimethoxysilane, 3-aminopropyltriethoxysilane, 3-aminopropylmethyldiethoxysilane, 3-phenylaminopropyltrimethoxysilane, 3-phenylaminopropyltriethoxysilane, 3-phenylaminopropylmethyldimethoxysilane, 3-phenylaminopropylmethyldiethoxysilane, 3-methylaminopropyltrimethoxysilane, 3-methylaminopropyltriethoxysilane, 3-ethylaminopropyltrimethoxysilane, and 3-ethylaminopropyltriethoxysilane.

Examples of the silane coupling agent in which X is the group represented by Formula (IIb) include 3-(2-aminoethyl)-3-aminopropyltrimethoxysilane, 3-(2-aminoethyl)-3-aminopropylmethyldimethoxysilane, 3-(2-aminoethyl)-3-aminopropyltriethoxysilane, 3-(2-aminoethyl)-3-aminopropylmethyldiethoxysilane, 3-(2-phenylaminoethyl)-3-aminopropyltrimethoxysilane, 3-(2-phenylaminoethyl)-3-aminopropyltriethoxysilane, 3-(2-phenylaminoethyl)-3-aminopropylmethyldimethoxysilane, 3-(2-methylaminoethyl)-3-aminopropyltrimethoxysilane, 3-(2-methylaminoethyl)-3-aminopropyltriethoxysilane, 3-(2-ethylaminoethyl)-3-aminopropyltrimethoxysilane, and N-(2-ethylaminoethyl)-3-aminopropyltriethoxysilane.

Examples of the silane coupling agent in which X is the group represented by Formula (IIc) include 3-isocyanatopropyltrimethoxysilane, 3-isocyanatopropylmethyldimethoxysilane, 3-isocyanatopropyltriethoxysilane, and 3-isocyanatopropylmethyldiethoxysilane.

Examples of the silane coupling agent in which X is the group represented by Formula (IId) include 3-ureidopropyltrimethoxysilane, 3-ureidopropylmethyldimethoxysilane, 3-ureidopropyltriethoxysilane, 3-ureidopropylmethyldiethoxysilane, 3-(3-phenylureido)propyltriethoxysilane, 3-(3-methylureido)propyltriethoxysilane, 3-(3-ethylureido)propyltriethoxysilane, 3-(3-propylureido)propyltriethoxysilane, 3-(3-butylureido)propyltriethoxysilane, 3-(3-hexylureido)propyltriethoxysilane, 3-(3-phenylureido)propyltrimethoxysilane, 3-(3-methylureido)propyltrimethoxysilane, 3-(3-ethylureido)propyltrimethoxysilane, 3-(3-propylureido)propyltrimethoxysilane, 3-(3-butylureido)propyltrimethoxysilane, and 3-(3-hexylureido)propyltrimethoxysilane.

Examples of the silane coupling agent in which X is the group represented by Formula (IIe) include 3-glycidoxypropyltrimethoxysilane, 3-glycidoxypropylmethyldimethoxysilane, 3-glycidoxypropyltriethoxysilane, and 3-glycidoxypropylmethyldiethoxysilane.

The content of the coupling agent may be 1 to 40 parts by mass with respect to 100 parts by mass of the content of the thermoplastic resin. When the content of the silane coupling agent is 1% by mass or more, there is a tendency that peelability from the lead frame after the thermal treatment is further improved. When the content of the coupling agent is 40% by mass or less, gelation of the varnish for forming the adhesive layer 2, a decrease in viscosity, and the like are less likely to occur, and the temporary protective film can be more easily produced. From the same viewpoint, the content of the coupling agent may be 1 to 35 parts by mass, 2 to 35 parts by mass, 3 to 30 parts by mass, more than 5 parts by mass and 35 parts by mass or less, more than 5 parts by mass and 30% by mass or less, or more than 5 parts by mass and 20 parts by mass or less, with respect to 100 parts by mass of the content of the thermoplastic resin.

The adhesive layer 2 may further contain a filler. Examples of the filler include ceramic powder, glass powder, silver powder, copper powder, resin particles, and rubber particles. The content of the filler may be 0 to 30 parts by mass, 1 to 30 parts by mass, or 5 to 15 parts by mass with respect to 100 parts by mass of the content of the thermoplastic resin.

The total content of the thermoplastic resin, the specific compound (an epoxy compound or the like), and the coupling agent or the total content of the thermoplastic resin, the specific compound (an epoxy compound or the like), the coupling agent, and the filler in the adhesive layer 2 may be 90 to 100% by mass on the basis of the mass of the adhesive layer 2.

The thickness of the adhesive layer 2 may be 20 μm or less, 18 μm or less, 16 μm or less, 14 μm or less, 12 μm or less, 10 μm or less, 9 μm or less, or 8 μm or less, from the viewpoint of more easily suppressing the curling of the temporary protective film. The thickness of the adhesive layer 2 may be 1 μm or more, 2 μm or more, 3 μm or more, 4 μm or more, 5 μm or more, 6 μm or more, 7 μm or more, or 8 μm or more.

The support film 1 may be, for example, a film of at least one polymer selected from the group consisting of an aromatic polyimide, an aromatic polyamide, an aromatic polyamideimide, an aromatic polysulfone, an aromatic polyethersulfone, a polyphenylene sulfide, an aromatic polyether ketone, a polyallylate, an aromatic polyether ether ketone, and polyethylene naphthalate. The support film 1 may be film-shaped copper, aluminum, stainless steel, or nickel. In a case where the support film 1 is a polymer film, the surface thereof may be surface-treated by methods of chemical treatments such as an alkali treatment and a silane coupling treatment, physical treatments such as a sand mat treatment, a plasma treatment, a corona treatment, and the like.

The thickness of the support film 1 may be, for example, 5 to 100 μm or 5 to 50 μm or less. A ratio $T_2/T_1$ of a thickness $T_2$ of the adhesive layer with respect to a thickness $T_1$ of the support film may be 0.5 or less, 0.3 or less, or 0.2 or less.

The non-adhesive layer 3 is a resin layer that substantially does not have adhesiveness (or pressure-sensitive adhesiveness) to the lead frame at 0 to 270° C. The non-adhesive layer may be a resin layer that is not easily softened at a high temperature, and for example, a resin layer having a high glass transition temperature can function as a non-adhesive layer.

The resin layer as the non-adhesive layer 3 contains a thermoplastic resin, a thermosetting resin (a cured product) or a resin that is a combination of a thermoplastic resin and a thermosetting resin. The thermoplastic resin may have an amide group, an ester group, an imide group, an oxy group, or a sulfonyl group. The thermosetting resin may be, for example, an epoxy resin, a phenolic resin, or a bismaleimide resin. In a case where the thermoplastic resin and the thermosetting resin are combined, the amount of the thermosetting resin may be 5 to 100 parts by mass or 20 to 70 parts by mass with respect to 100 parts by mass of the content of the thermoplastic resin.

The non-adhesive layer 3 may contain a filler (for example, ceramic powder, glass powder, silver powder, copper powder, resin particles, or rubber particles), a coupling agent, and the like. The content of the filler in the non-adhesive layer 3 may be 1 to 30 parts by mass or 5 to 15 parts by mass with respect to 100 parts by mass of the content of the resin. The content of the coupling agent may be 1 to 20 parts by mass or 2 to 15 parts by mass with respect to 100 parts by mass of the content of the resin.

The 90-degree peeling strength of the non-adhesive layer 3 with respect to a mold made of brass at 25° C. may be less than 5 N/m or 1 N/m or less. The peeling strength is measured after the non-adhesive layer 3 is pressure-bonded to the mold made of brass at a temperature of 250° C. and a pressure of 8 MPa for 10 seconds.

The thickness of the non-adhesive layer 3 may be, for example, 10 μm or less, 9 μm or less, 8 μm or less, or 7 μm or less. The thickness of the non-adhesive layer may be, for example, 1 μm or more, 2 μm or more, 3 μm or more, 4 μm or more, 5 μm or more, or 6 μm or more. The thickness of the non-adhesive layer is not particularly limited, and may be, for example, 1 to 10 μm or 1 to 8 μm.

The temporary protective film can be produced, for example, by a method including a step of applying a varnish containing a thermoplastic resin, a specific compound (an epoxy compound or the like), and a solvent to a support film and removing the solvent from the coating film to form an adhesive layer. The non-adhesive layer can also be formed by the same method.

Method for Manufacturing Semiconductor Package

A semiconductor package can be manufactured using the temporary protective film according to the embodiment illustrated above. The semiconductor package thus manufactured is, for example, a Non Lead Type Package, which has a lead frame, a semiconductor element mounted thereon, and a sealing layer sealing the semiconductor element on the semiconductor element side of the lead frame, with the rear surface of the lead frame being exposed for external connection. Specific examples thereof include QFN (QuadFlat Non-leaded Package) and SON (Small Outline Non-leaded Package).

Figure 3:
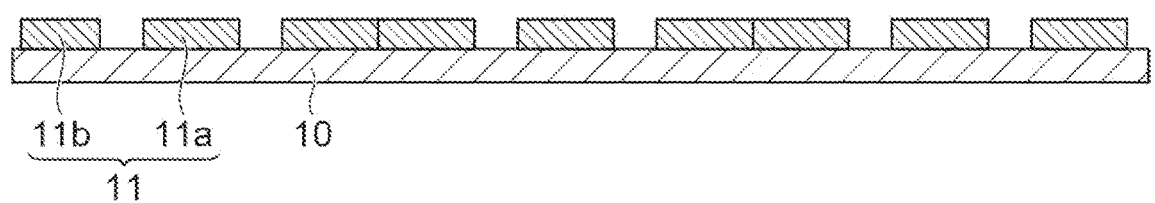
FIG. 3 is a cross-sectional view describing an embodiment of a method for manufacturing a semiconductor package.
Figure 4:
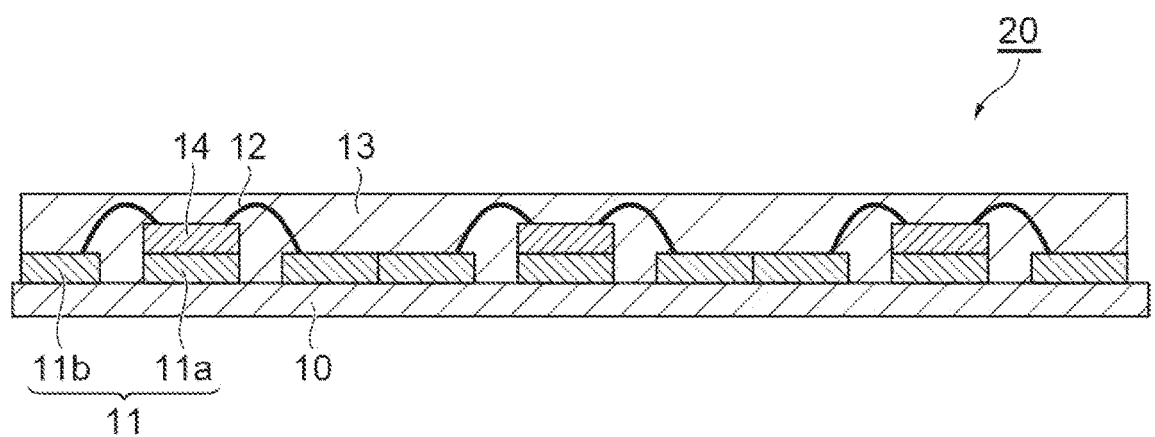
FIG. 4 is a cross-sectional view describing an embodiment of the method for manufacturing a semiconductor package.
Figure 5:
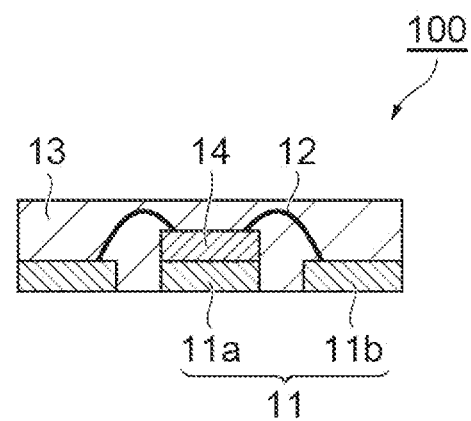
FIG. 5 is a cross-sectional view illustrating an embodiment of a semiconductor package.

FIGS. 3 and 4 are cross-sectional views illustrating an embodiment of a method for manufacturing a semiconductor package. FIG. 5 is a cross-sectional view illustrating an embodiment of the semiconductor package obtained by the manufacturing method of FIGS. 3 and 4. Hereinafter, each step will be described with reference to each drawing as necessary.

The method illustrated in FIG. 3 and FIG. 4 includes, in the stated order: a step of bonding the temporary protective film 10 to a rear surface that is one surface of a lead frame 11 having a die pad 11a and an inner lead 11b in a direction in which the adhesive layer of the temporary protective film 10 comes into contact with the lead frame 11; a step of mounting a semiconductor element 14 on a surface of the die pad 11a on a side opposite to the temporary protective film 10; a step of providing a wire 12 connecting the semiconductor element 14 and the inner lead 11b; a step of forming a sealing layer 13 sealing the semiconductor element 14 and the wire 12 to obtain a temporarily protected encapsulation molded body 20 having the lead frame 11, the semiconductor element 14, and the sealing layer 13; and a step of peeling off the temporary protective film 10 from the encapsulation molded body 20. The temporarily protected encapsulation molded body has the encapsulation molded body 20 and the temporary protective film 10.

The step of bonding the temporary protective film 10 to the lead frame 11 may include heating and pressurizing the temporary protective film 10 disposed on the lead frame 11. The heating temperature may be 150° C. or higher, 180° C. or higher, or 200° C. or higher, and may be 400° C. or lower. The pressure may be 0.5 to 30 MPa, 1 to 20 MPa, or 3 to 15 MPa. The time for heating and pressurizing may be 0.1 to 60 seconds, 1 to 30 seconds, or 3 to 20 seconds.

The lead frame 11 may be formed from, for example, an iron-based alloy such as Alloy 42, copper, or a copper-based alloy. The lead frame 11 may have a molded body formed from a copper or a copper-based alloy and a coating layer of palladium, gold, silver, or the like that covers the surface of the molded body.

The semiconductor element 14 is usually attached to the die pad 11a through an adhesive (for example, a silver paste). After the semiconductor element 14 is attached to the die pad 11a, reflow connection (Cu Clip connection or the like) may be performed under the conditions of a maximum temperature of 250 to 440° C. or a temperature of 250 to 400° C. for 1 to 30 minutes.

The wire 12 is not particularly limited, and may be, for example, a gold wire, a copper wire, or a palladium-coated copper wire. For example, the semiconductor element 14 and the inner lead 11b may be joined with the wire 12 by heating at 200 to 260° C. or 350 to 260° C. for 3 to 60 minutes and utilizing ultrasonic waves and a pressing pressure.

The sealing layer 13 is formed by encapsulation molding using a sealing material. Through encapsulation molding, the encapsulation molded body 20 having a plurality of semiconductor elements 14 and the sealing layer 13 integrally sealing these semiconductor elements may be obtained. Since the temporary protective film 10 is provided during the encapsulation molding, the sealing material is inhibited from wrapping around the rear surface side of the lead frame 11.

The temperature during the formation of the sealing layer 13 (the temperature of the sealing material) may be 140 to 200° C. or 160 to 180° C. The pressure during the formation of the sealing layer may be 6 to 15 MPa or 7 to 10 MPa. The time for the encapsulation molding may be 1 to 5 minutes or 2 to 3 minutes.

The sealing layer 13 thus formed may be cured by heating as necessary. The heating temperature for curing the sealing layer 13 may be 150 to 200° C. or 160 to 180° C. The heating time for curing the sealing layer 13 may be 4 to 7 hours or 5 to 6 hours.

The sealing material may contain, for example, epoxy resins such as a cresol novolac epoxy resin, a phenol novolac epoxy resin, a biphenyl diepoxy resin, and a naphthol novolac epoxy resin. The sealing material may contain a filler, a flame retardant substance such as a bromine compound, a wax component, and the like.

After the encapsulation molding of forming the sealing layer 13, the temporary protective film 10 is peeled off from the lead frame 11 and the sealing layer 13 of the encapsulation molded body 20 thus obtained. In the case of curing the sealing layer 13, the temporary protective film 10 may be peeled off at any time point before or after curing of the sealing layer 13.

The temperature at which the temporary protective film 10 is peeled off from the encapsulation molded body 20 may be 0 to 250° C., 100 to 200° C., or 150 to 250° C.

After the temporary protective film 10 is peeled off from the lead frame 11, in a case where a part of the adhesive layer remains on the lead frame 11 and the sealing layer 13, the remaining adhesive layer may be removed. The remaining adhesive layer may be removed by mechanical brushing or a solvent. The solvent may be, for example, N-methyl-2-pyrrolidone, dimethylacetamide, diethylene glycol dimethyl ether, tetrahydrofuran, cyclohexanone, methyl ethyl ketone, or dimethylformamide.

In a case where the lead frame has a plurality of patterns each having a die pad and an inner lead, as necessary, a plurality of semiconductor packages 100 of FIG. 5 each having one semiconductor element can be obtained by dividing the encapsulation molded body 20. That is, in a case where the lead frame 11 has a plurality of the die pads 11a and the semiconductor element 14 is mounted on each of the plurality of the die pads 11a, the manufacturing method according to an embodiment may further include a step of dividing the encapsulation molded body 20 to obtain the semiconductor package 100 having one die pad 11a and the semiconductor element 14, after peeling off the temporary protective film 10 (or 10') from the encapsulation molded body 20.

An elongated temporary protective film may be wound around a core, and a semiconductor package may be manufactured while the temporary protective film is unwound from the obtained reel body. The reel body in this case has a core and the temporary protective film according to the aforementioned embodiment wound around the core.

Figure 6:
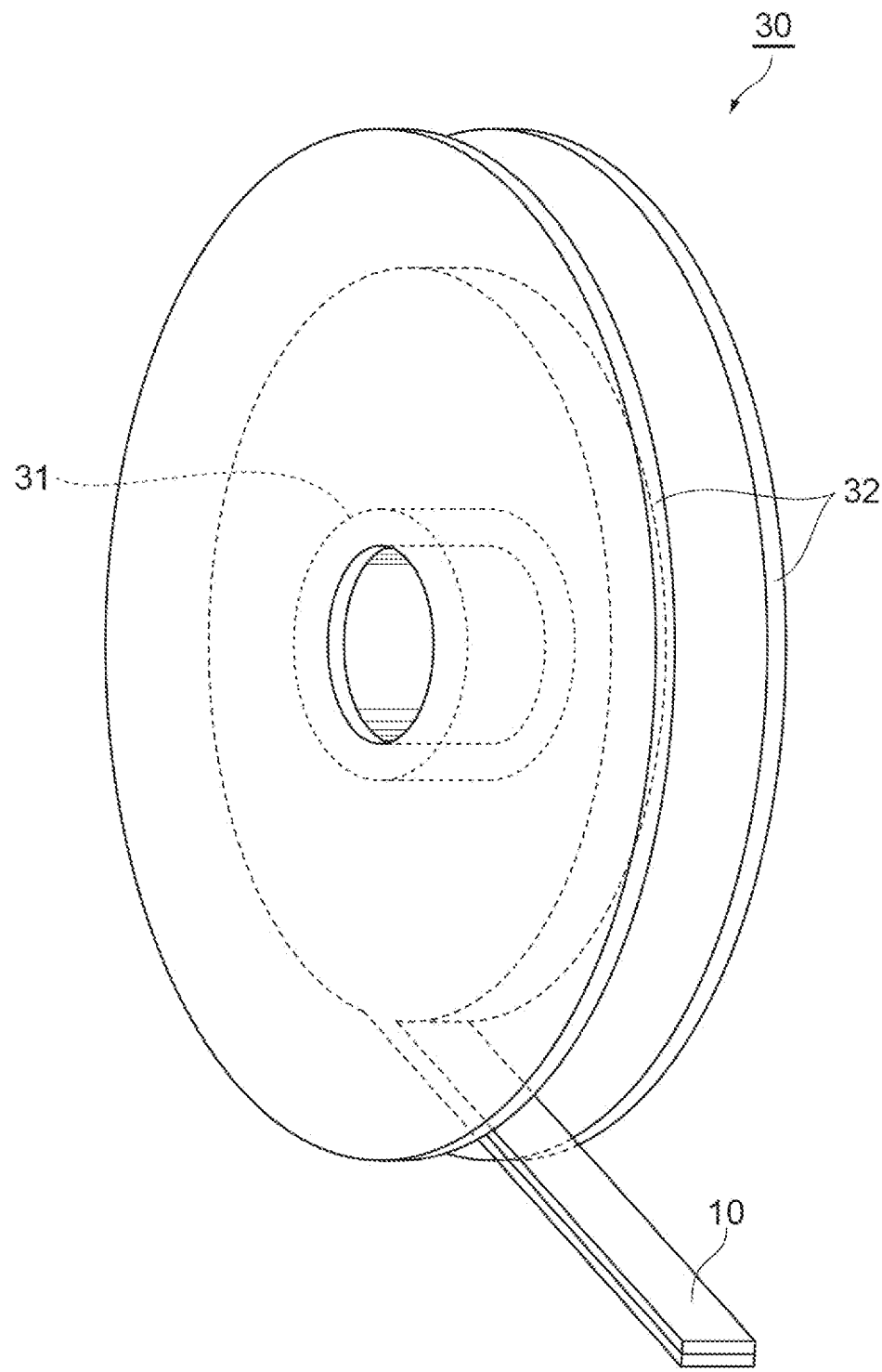
FIG. 6 is a perspective view illustrating an embodiment of a reel body.

FIG. 6 is a perspective view illustrating an embodiment of a reel body. A reel body 30 illustrated in FIG. 6 has a core 31, the temporary protective film 10 wound around the core 31, and a side plate 32. The width (length in a direction orthogonally intersecting the winding direction) of the core 31 and the temporary protective film 10 may be, for example, 0.001 cm or more, 0.005 cm or more, or 0.008 cm or more, and may be 0.03 cm or less. The width (length in the direction orthogonally intersecting the winding direction) of the core 31 and the temporary protective film 10 may be, for example, 0.001 cm or more and 0.03 cm or less, 0.005 cm and 0.03 cm or less, or 0.008 cm or more and 0.03 cm or less.

Figure 7:
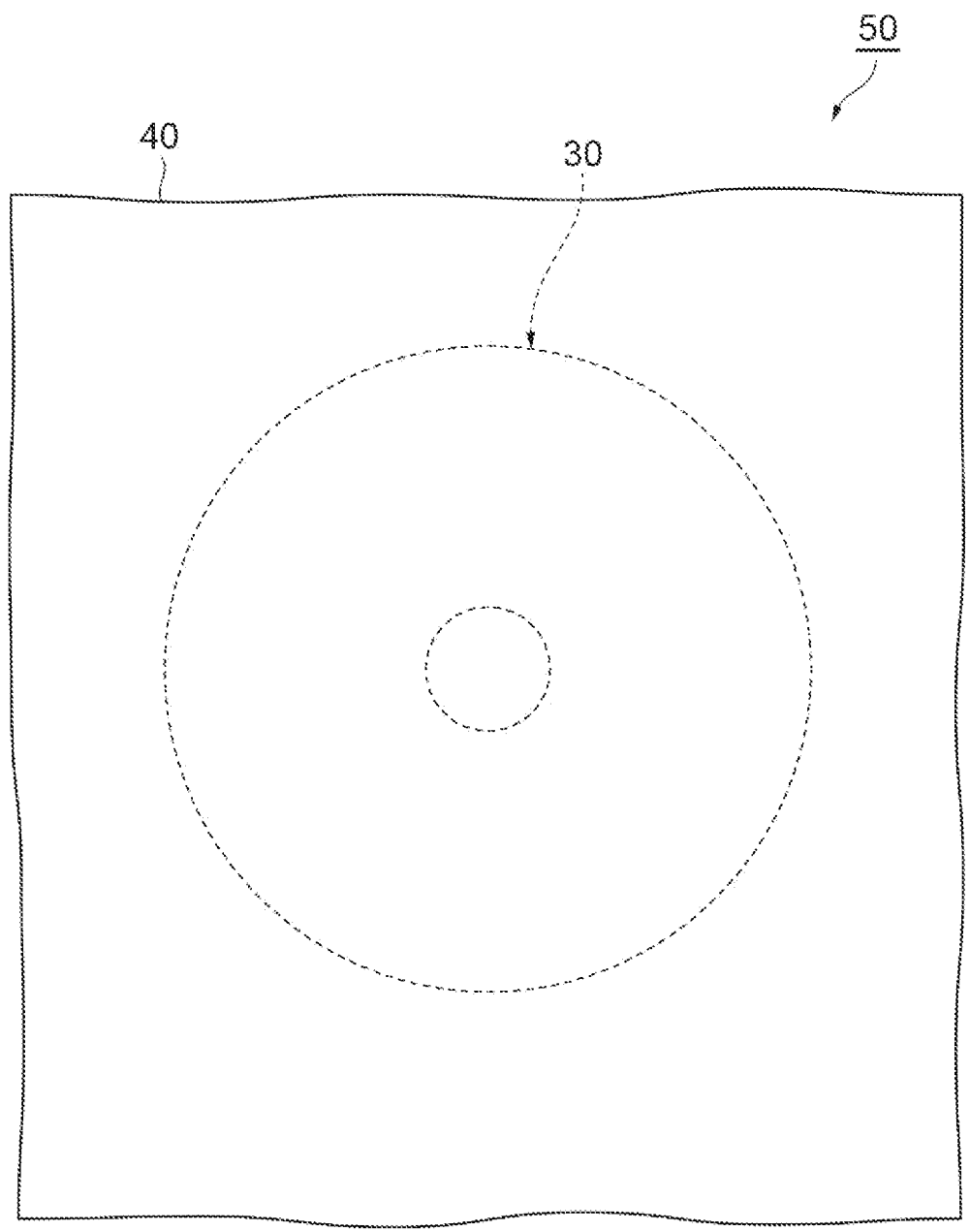
FIG. 7 is a front view illustrating an embodiment of a package body.

The temporary protective film according to the aforementioned embodiment may be provided as a package body in which the reel body is accommodated in a packaging bag. FIG. 7 illustrates an embodiment of a package body. As illustrated in FIG. 7, a package body 50 has the reel body 30 and a packaging bag 40 accommodating the reel body 30. The reel body 30 is usually individually accommodated in a packaging bag; however, a plurality of (for example, two or three of) the reel bodies 30 may be accommodated in one packaging bag 40.

The packaging bag 40 may be formed from a resin film, and may be formed from a composite film that is a resin film having an aluminum layer. Specific examples of the packaging bag 40 include an aluminum-coated plastic bag. Examples of the material for the resin film include plastics such as polyethylene, polyester, vinyl chloride, and polyethylene terephthalate. The reel body 30 may be, for example, accommodated in a packaging bag in a vacuum-packed state. The package body 50 is not limited to a vacuum-packed product.

In the packaging bag 40, a desiccant may be accommodated together with the reel body 30. Examples of the desiccant include silica gel. The package body 50 may further have a cushioning material which wraps the packaging bag 40 accommodating the reel body 30.

Figure 8:
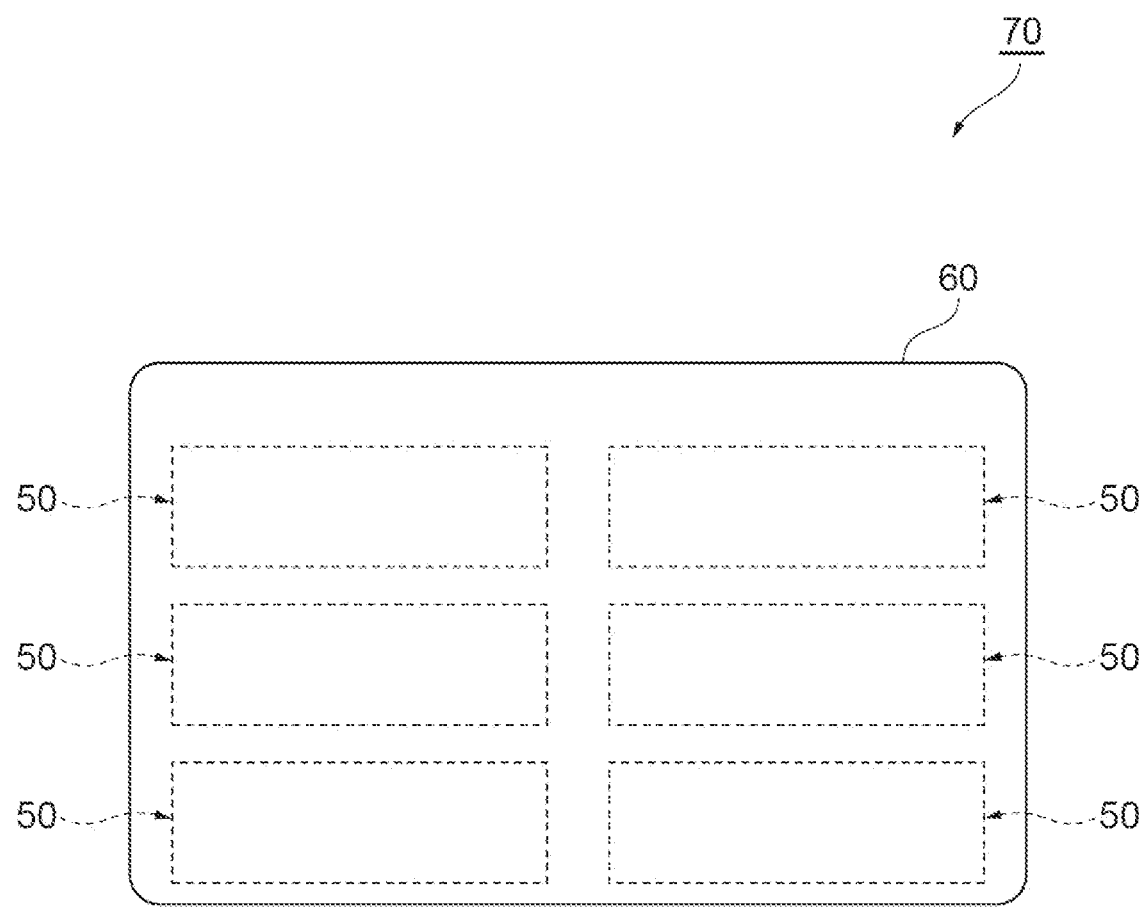
FIG. 8 is a front view illustrating an embodiment of a packed product.

The package body 50 may be provided as a packed product accommodated in a packing box. FIG. 8 illustrates an embodiment of a packed product. As illustrated in FIG. 8, a packed product 70 has the package body 50 and a packing box 60 accommodating the package body 50. In the packing box 60, one or a plurality of the package bodies 50 are accommodated. As the packing box 60, for example, corrugated cardboard can be used.

The semiconductor package manufactured using the temporary protective film according to an embodiment is excellent in view of density increase, area reduction, thickness reduction, and the like, and can be suitably utilized, for example, in electronic instruments such as mobile telephones, smart phones, personal computers, and tablets.

EXAMPLES

Hereinafter, the present invention will be more specifically described by reference to Examples. However, the present invention is not limited to these Examples.

1. Production of Temporary Protective Film

Example 1

An aromatic polyether amideimide that is a polycondensate formed from 270.9 g (0.63 mol) of 2,2-bis[4-(4-aminophenoxy)phenyl]propane, 67.0 g (0.27 mol) of 1,3-bis(3-aminopropyl)-tetramethyldisiloxane, and 187.3 g (0.89 mol) of trimellitic anhydride chloride was prepared. One hundred parts by mass of this aromatic polyether amideimide, 7 parts by mass of sorbitol polyglycidyl ether (manufactured by Nagase ChemteX Corporation, trade name: EX-614B, epoxy equivalent: 173 g/eq.), and 3 parts by mass of 3-glycidoxypropyltrimethoxysilane (manufactured by Dow Corning Toray Silicone Co., Ltd., trade name: SH6040) were dissolved in N-methylpyrrolidone to obtain a varnish for forming an adhesive layer.

The obtained varnish was applied onto one surface of a support film. As the support film, a polyimide film (thickness: 25 μm, manufactured by Ube Industries, Ltd., trade name: UPILEX SGA) having a chemical-treated surface was used. The coating film on the support film was dried by heating at 100° C. for 10 minutes and at 200° C. for 10 minutes to form an adhesive layer having a thickness of 6 μm, thereby obtaining a temporary protective film of Example 1 having the support film and the adhesive layer.

Example 2

A varnish for forming an adhesive layer and a temporary protective film were obtained in the same manner as in Example 1, except that the amount of sorbitol polyglycidyl ether was changed to 10 parts by mass with respect to 100 parts by mass of the aromatic polyether amideimide.

Example 3

A varnish for forming an adhesive layer and a temporary protective film were obtained in the same manner as in Example 1, except that polyethylene glycol diglycidyl ether (manufactured by Kyoeisha Chemical Co., Ltd., trade name: EPOLIGHT 400E, epoxy equivalent: 264 to 290 g/eq.) was used instead of sorbitol polyglycidyl ether, and the amount thereof was set to 10 parts by mass with respect to 100 parts by mass of the aromatic polyether amideimide.

Example 4

A varnish for forming an adhesive layer and a temporary protective film were obtained in the same manner as in Example 1, except that a mixture of a glycidyl ether of an alkyl alcohol having 12 carbon atoms and a glycidyl ether of an alkyl alcohol having 13 carbon atoms (manufactured by Kyoeisha Chemical Co., Ltd., trade name: EPOLIGHT M-1230, epoxy equivalent: 295 to 320 g/eq.) was used instead of sorbitol polyglycidyl ether, and the amount thereof was set to 10 parts by mass with respect to 100 parts by mass of the aromatic polyether amideimide.

Example 5

A varnish for forming an adhesive layer and a temporary protective film were obtained in the same manner as in Example 1, except that glycerol polyglycidyl ether (manufactured by Nagase ChemteX Corporation, trade name: EX-313, epoxy equivalent: 141 g/eq.) was used instead of sorbitol polyglycidyl ether, and the amount thereof was set to 10 parts by mass with respect to 100 parts by mass of the aromatic polyether amideimide.

Example 6

A varnish for forming an adhesive layer and a temporary protective film were obtained in the same manner as in Example 1, except that dipentaerythritol aliphatic saturated monobasic acid (the number of carbon atoms: 4 to 12) hexaester (manufactured by ADEKA Corporation, trade name: ADK CIZER UL-6) was used instead of sorbitol polyglycidyl ether, and the amount thereof was set to 10 parts by mass with respect to 100 parts by mass of the aromatic polyether amideimide.

Example 7

A varnish for forming an adhesive layer and a temporary protective film were obtained in the same manner as in Example 1, except that dipentaerythritol aliphatic saturated monobasic acid (the number of carbon atoms: 4 to 12) hexaester (manufactured by ADEKA Corporation, trade name: ADK CIZER UL-6) was used instead of sorbitol polyglycidyl ether, and the amount thereof was set to 20 parts by mass with respect to 100 parts by mass of the aromatic polyether amideimide.

Example 8

A varnish for forming an adhesive layer and a temporary protective film were obtained in the same manner as in Example 1, except that polyoxyalkylene mono- or di-fatty acid (the number of carbon atoms: 6 to 24) ester (manufactured by ADEKA Corporation, trade name: ADK CIZER RS-700) was used instead of sorbitol polyglycidyl ether, and the amount thereof was set to 10 parts by mass with respect to 100 parts by mass of the aromatic polyether amideimide.

Example 9

A varnish for forming an adhesive layer and a temporary protective film were obtained in the same manner as in Example 1, except that polyoxyalkylene mono- or di-fatty acid (the number of carbon atoms: 6 to 24) ester (manufactured by ADEKA Corporation, trade name: ADK CIZER RS-700) was used instead of sorbitol polyglycidyl ether, and the amount thereof was set to 20 parts by mass with respect to 100 parts by mass of the aromatic polyether amideimide.

Example 10

A varnish for forming an adhesive layer and a temporary protective film were obtained in the same manner as in Example 1, except that polyoxyethylene (9) secondary alkyl (the number of carbon atoms: 11 to 15) ether (manufactured by Kao Corporation, trade name: EMULGEN 709) was used instead of sorbitol polyglycidyl ether, and the amount thereof was set to 10 parts by mass with respect to 100 parts by mass of the aromatic polyether amideimide.

Example 11

A varnish for forming an adhesive layer and a temporary protective film were obtained in the same manner as in Example 1, except that polyoxyethylene (9) secondary alkyl (the number of carbon atoms: 11 to 15) ether (manufactured by Kao Corporation, trade name: EMULGEN 709) was used instead of sorbitol polyglycidyl ether, and the amount thereof was set to 20 parts by mass with respect to 100 parts by mass of the aromatic polyether amideimide.

Comparative Example 1

A varnish for forming an adhesive layer and a temporary protective film were obtained in the same manner as in Example 1, except that a glycidyl ether of lauryl alcohol ethylene oxide adduct (manufactured by Nagase ChemteX Corporation, trade name: EX-171, epoxy equivalent: 971 g/eq.) was used instead of sorbitol polyglycidyl ether, and the amount thereof was set to 10 parts by mass with respect to 100 parts by mass of the aromatic polyether amideimide.

Comparative Example 2

A varnish for forming an adhesive layer and a temporary protective film were obtained in the same manner as in Example 1, except that 1,6-hexanediol diglycidyl ether (manufactured by Nagase ChemteX Corporation, trade name: EX-212, epoxy equivalent: 151 g/eq.) was used instead of sorbitol polyglycidyl ether, and the amount thereof was set to 10 parts by mass with respect to 100 parts by mass of the aromatic polyether amideimide.

Comparative Example 3

A varnish for forming an adhesive layer and a temporary protective film were obtained in the same manner as in Example 1, except that ethylene glycol diglycidyl ether (manufactured by Nagase ChemteX Corporation, trade name: EX-810, epoxy equivalent: 113 g/eq.) was used instead of sorbitol polyglycidyl ether, and the amount thereof was set to 10 parts by mass with respect to 100 parts by mass of the aromatic polyether amideimide.

Comparative Example 4

A varnish for forming an adhesive layer and a temporary protective film were obtained in the same manner as in Example 1, except that a polyglycidyl ether of an aliphatic polyol (manufactured by Nagase ChemteX Corporation, epoxy equivalent: 164 g/eq.) was used instead of sorbitol polyglycidyl ether, and the amount thereof was set to 10 parts by mass with respect to 100 parts by mass of the aromatic polyether amideimide.

Comparative Example 5

A varnish for forming an adhesive layer and a temporary protective film were obtained in the same manner as in Example 1, except that polypropylene glycol diglycidyl ether (manufactured by Kyoeisha Chemical Co., Ltd., trade name: EPOLIGHT 400P, epoxy equivalent: 264 to 290 g/eq.) was used instead of sorbitol polyglycidyl ether, and the amount thereof was set to 10 parts by mass with respect to 100 parts by mass of the aromatic polyether amideimide.

Comparative Example 6

A varnish for forming an adhesive layer and a temporary protective film were obtained in the same manner as in Example 1, except that sorbitol polyglycidyl ether was not used.

2. Peeling Strength (1) After Bonding

The temporary protective film was bonded to a copper plate for a lead frame (size: 50 mm×200 mm, manufactured by SHINKO ELECTRIC INDUSTRIES CO., LTD., the plate obtained by processing "trade name: EFTEC-64T" manufactured by Furukawa Electric Co., Ltd., which had been subjected to a plasma irradiation treatment) under the conditions of a temperature of 235° C. and a pressure of 6 MPa for 10 seconds in a direction in which the adhesive layer was in contact with the copper plate. Next, the 90-degree peeling strength between the adhesive layer and the copper plate at 25° C. was measured under the condition of a speed of tear-off: 300 mm per minute.

(2) After Thermal Treatment

The temporary protective film was bonded to a copper plate for a lead frame (size: 50 mm×200 mm, manufactured by SHINKO ELECTRIC INDUSTRIES CO., LTD., the plate obtained by processing "trade name: EFTEC-64T" manufactured by Furukawa Electric Co., Ltd., which had been subjected to a plasma irradiation treatment) under the conditions of a temperature of 235° C. and a pressure of 6 MPa for 10 seconds in a direction in which the adhesive layer was in contact with the copper plate. Next, the copper plate and the temporary protective film bonded thereto were subjected to a thermal treatment by heating at 180° C. for 1 hour and subsequently heating at 400° C. for 2 minutes. After the thermal treatment, the 90-degree peeling strength between the adhesive layer and the copper plate at 200° C. was measured under the condition of a speed of tear-off: 300 mm per minute.

TABLE 1

| | | | Peeling strength [N/m] | |
| --- | --- | --- | --- | --- |
| | Specific compound | Content/ parts by mass | After bonding (peeling temperature: 25° C.) | After thermal treatment (peeling temperature: 200° C.) |
| Ex. 1 | EX-614B | 7 | 1013 | 135 |
| Ex. 2 | EX-614B | 10 | 1025 | 161 |
| Ex. 3 | EPOLIGHT 400E | 10 | 613 | 50 |
| Ex. 4 | EPOLIGHT M-1230 | 10 | 338 | 299 |
| Ex. 5 | EX-313 | 10 | 400 | 347* |
| Ex. 6 | ADK CIZER UL-6 | 10 | 130 | 250** |
| Ex. 7 | ADK CIZER UL-6 | 20 | 120 | 220** |
| Ex. 8 | ADK CIZER RS-700 | 10 | 730 | 490 |
| Ex. 9 | ADK CIZER RS-700 | 20 | 720 | 400 |
| Ex. 10 | EMULGEN 709 | 10 | 550 | 500* |
| Ex. 11 | EMULGEN 709 | 20 | 480 | 250* |
| Comp. Ex. 1 | EX-171 | 10 | 388 | 454* |
| Comp. Ex. 2 | EX-212 | 10 | 288 | 646* |
| Comp. Ex. 3 | EX-810 | 10 | 738 | 580* |
| Comp. Ex. 4 | EX-1610 | 10 | 1200 | 600* |
| Comp. Ex. 5 | EPOLIGHT 400P | 10 | 325 | 469* |
| Comp. Ex. 6 | None | — | 800 | 590 |

*There are residues
**There are slight residues.

The evaluation results of the peeling strength after the bonding and after the thermal treatment are shown in Table 1. The temporary protective film of each Example exhibited an appropriate peeling strength after the bonding and showed a sufficiently reduced peeling strength after the thermal treatment. In the peeling strength measurement after the thermal treatment of Examples 5 and 10 and Comparative Examples 1 to 5, occurrence of residues of some of the adhesive layer remaining on the lead frame was recognized. Particularly, in the case of Comparative Examples 1, 2, and 5, since the temporary protective film was torn during peeling, it was difficult to clearly peel off the temporary protective film from the copper plate by a single peeling operation. In Examples 6 and 7, occurrence of thin residues was recognized.

REFERENCE SIGNS LIST

1: support film, 2: adhesive layer, 3: non-adhesive layer, 10, 10': temporary protective film, 11: lead frame, 11a: die pad, 11b: inner lead, 12: wire, 13: sealing layer, 14: semiconductor element, 20: encapsulation molded body, 30: reel body, 31: core, 32: side plate, 40: packaging bag, 50: package body, 60: packing box, 70: packed product, 100: semiconductor package.

The invention claimed is:

1. A temporary protective film for semiconductor encapsulation molding, comprising: a support film; and an adhesive layer provided on one surface or both surfaces of the support film, wherein
   the adhesive layer comprises
   a thermoplastic resin, and
   at least one compound selected from the group consisting of sorbitol polyglycidyl ether, polyethylene glycol diglycidyl ether, a glycidyl ether of an aliphatic alcohol having 10 to 20 carbon atoms, glycerol polyglycidyl ether, a polyalkylene glycol ester of a fatty acid having 2 to 30 carbon atoms, a dipentaerythritol ester of a fatty acid having 2 to 20 carbon atoms, polyethylene glycol monoalkyl ether, and polyethylene glycol dialkyl ether, and wherein the thermoplastic resin comprises at least one selected from the group consisting of an aromatic polyether amideimide, an aromatic polyether imide, an aromatic polyether amide, an aromatic polyamide, an aromatic polyester, an aromatic polyimide, an aromatic polyamideimide, an aromatic polyether, and an aromatic polyester imide.

2. The temporary protective film according to claim 1, wherein a content of the compound is 5 to 30 parts by mass with respect to 100 parts by mass of a content of the thermoplastic resin.

3. A lead frame provided with a temporary protective film, comprising:
   a lead frame having a die pad; and
   the temporary protective film for semiconductor encapsulation molding according to claim 1, wherein
   the temporary protective film is bonded to a surface of the lead frame on a side opposite to the semiconductor element in a direction in which the adhesive layer of the temporary protective film comes into contact with the lead frame.

4. A temporarily protected encapsulation molded body, comprising:
   a lead frame having a die pad;
   a semiconductor element mounted on the die pad on one surface side of the lead frame;
   a sealing layer sealing the semiconductor element; and
   the temporary protective film according to claim 1, wherein
   the temporary protective film is bonded to a surface of the lead frame on a side opposite to the semiconductor element in a direction in which the adhesive layer of the temporary protective film comes into contact with the lead frame.

5. A method for manufacturing a semiconductor package, the method comprising:
   bonding the temporary protective film according to claim 1 to one surface of a lead frame having a die pad in a direction in which the adhesive layer of the temporary protective film comes into contact with the lead frame;
   mounting a semiconductor element on a surface of the die pad on a side opposite to the temporary protective film;
   forming a sealing layer sealing the semiconductor element to obtain a temporarily protected encapsulation molded body comprising the lead frame, the semiconductor element, the sealing layer, and the temporary protective film; and
   peeling off the temporary protective film from the encapsulation molded body.

6. The method according to claim 5, wherein the lead frame has a plurality of the die pads, and the semiconductor element is mounted on each of the plurality of the die pads, and
   the method further comprises dividing the encapsulation molded body subsequent to peeling off the temporary protective film from the encapsulation molded body, to obtain a semiconductor package comprising one die pad and the semiconductor element.

7. The temporary protective film according to claim 1, wherein the adhesive layer comprises at least one compound selected from the group consisting of polyethylene glycol diglycidyl ether, a glycidyl ether of an aliphatic alcohol having 10 to 20 carbon atoms, a polyalkylene glycol ester of a fatty acid having 2 to 30 carbon atoms, a dipentaerythritol ester of a fatty acid having 2 to 20 carbon atoms, polyethylene glycol monoalkyl ether, and polyethylene glycol dialkyl ether.

8. The temporary protective film according to claim 1, wherein the adhesive layer is configured to have a 90° peel strength of 500 N/m or less at 200° C. against a lead frame when an adhesive layer side of the temporary protective film is attached to the lead frame and the temporary protective film is then subjected to heat treatment at 180° C. for one hour and, subsequently, at 400° C. for two minutes, followed by cooling to 200° C.

* * * * *